United States Patent [19]
Bouley

[11] Patent Number: 4,681,391
[45] Date of Patent: Jul. 21, 1987

[54] ELECTRIC CONNECTOR

[75] Inventor: Jean C. Bouley, Dole, France

[73] Assignee: Allied Corporation, Morris Township, Morris County, N.J.

[21] Appl. No.: 805,665

[22] Filed: Dec. 6, 1985

[30] Foreign Application Priority Data

Dec. 19, 1984 [FR] France .................. 84 19441

[51] Int. Cl.$^4$ ............................................ H01R 33/76
[52] U.S. Cl. ...................................... 439/444; 439/525; 439/886
[58] Field of Search ............ 339/192 R, 198 R, 17 C, 339/17 CF, 176 M, 258 R, 258 F, 256 R, 252 R, 75 M, 192 RL, 176 MP, 258 P

[56] References Cited

U.S. PATENT DOCUMENTS

| | | | |
|---|---|---|---|
| 2,429,810 | 10/1947 | Gottlieb et al. | 339/258 P |
| 3,710,299 | 1/1973 | Weisenburger | 339/17 CF |
| 3,783,030 | 1/1974 | Tietze | 339/252 R |
| 3,993,381 | 11/1976 | Horbach | 339/17 CF |
| 4,045,105 | 8/1977 | Lee et al. | 339/17 CF |
| 4,060,296 | 11/1977 | Kunkle et al. | 339/17 CF |
| 4,157,207 | 6/1979 | Robinson | 339/258 P |
| 4,410,231 | 10/1983 | Senor | 339/17 CF |

FOREIGN PATENT DOCUMENTS

| | | |
|---|---|---|
| 0711924 | 9/1941 | Fed. Rep. of Germany ... 339/252 R |
| 2097358 | 3/1972 | France . |
| 2368158 | 5/1978 | France . |
| 2462795 | 3/1981 | France . |

Primary Examiner—Gil Weidenfeld
Assistant Examiner—Thomas M. Kline
Attorney, Agent, or Firm—Roger H. Criss

[57] ABSTRACT

An electrical connector for assembly of an electronic component with two parallel rows of terminals onto a printed circuit board, the connector including an insulating block having two rows of cavities, each cavity containing a contact element introduced through an opening provided at the top of the cavity and a leg projecting at the bottom of the cavity for connection to the printed circuit board. The contact element comprises a substantially flat web portion pressing against the side of the cavity adjacent to an outer longitudinal face of the insulating block. A central part of the web portion is cut out and bent to form a contact tab extending out of the plane of the web portion. The tab is resiliently urged towards the bottom of the opposite wall of the cavity to cooperate with a male contact element which is inserted into the cavity.

8 Claims, 5 Drawing Figures

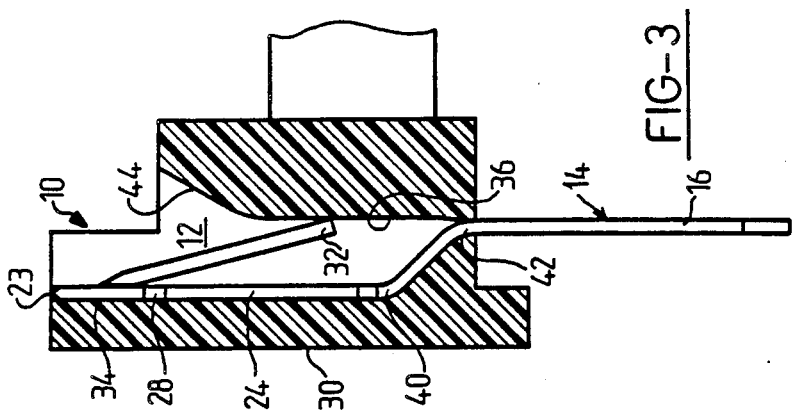
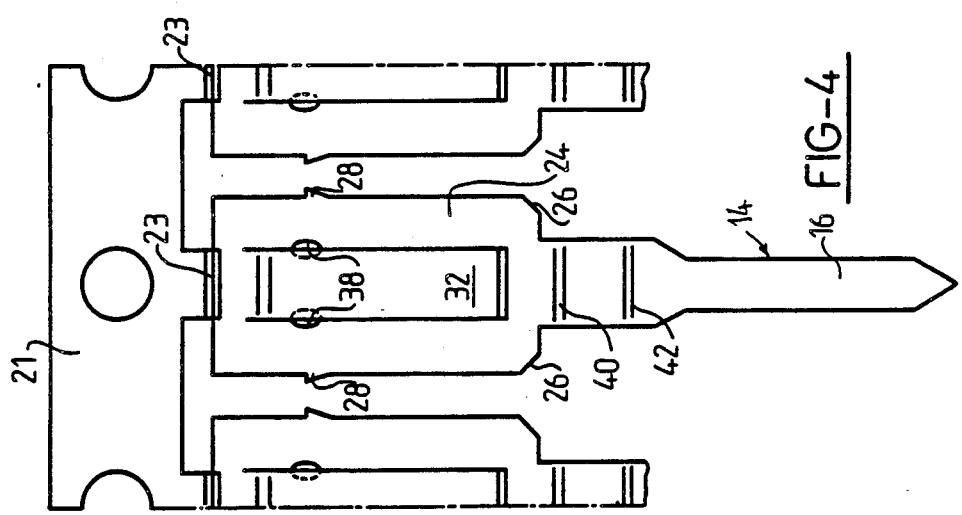
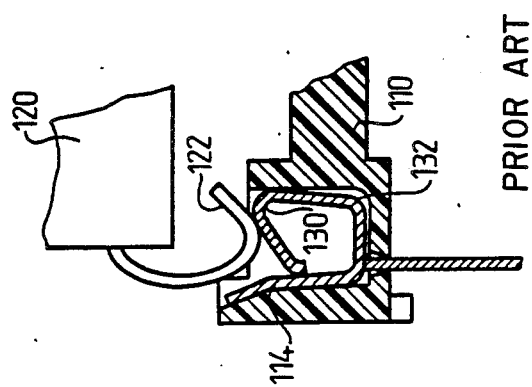

ELECTRIC CONNECTOR

BACKGROUND OF THE INVENTION

1. Field of the Invention

This invention relates to an electrical connector, particularly a printed circuit board connector.

2. Description of the Prior Art

An electrical connector for use in mounting an electronic component having two parallel rows of terminals on a support such as a printed circuit is known. Such a connector has a parallelopipedic block of insulation having two rows of cavities, each cavity containing a contact element which is introduced through an opening provided at the top of the cavity and including a leg projecting through a substantially sealed passage at the bottom of the cavity for connection with the printed circuit board.

A connector of this type is described in the French patent application 77/31029 published under No. 2,368,158. In this connector the contact element has two contact surfaces, namely a web and a strip bent towards it which has a loop substantially in the plane of the upper opening of the cavity.

The presence of this loop is an interference since, when it is presented, the male contact element which generally consists of a flexible tab, can be flattened against the loop instead of engaging correctly in a two-surface contact. When this happens, control tests indicate a connection made electrically, but this connection is imperfect and resistance to vibration cannot be assumed.

French Pat. No. Fr 70/24728, published under No. 2,097,358, has already proposed an elastic contact element pressing on the bottom of the cavity and comprising, as the active part in contact with the male contact element, the single turn of a conductive blade coiled in a flat spiral. The proposed device is difficult to manufacture and in addition it has numerous drawbacks: the elastic force of the loop is difficult to control and the contact surface on which particles of plastic accumulate rapidly becomes fouled.

It would be desirable to provide an electrical connector which avoids these drawbacks.

SUMMARY OF THE INVENTION

In accordance with this invention, there is provided in an electrical connector particularly for use in mounting an electronic component having two parallel rows of terminals to a support, such as a printed circuit board, the connector comprising an insulating block having two rows of cavities, each cavity containing a contact element introduced through an opening provided at the top of the cavity, the contact element including a leg projecting through a substantially sealed passage at the bottom of the cavity for connection with the support, the improvement comprising the contact element comprises a substantially flat web portion pressing against a first wall of the cavity adjacent to an external longitudinally extending face of the insulating block, the central portion of the web portion being cut out and bent to form a contact tab extending out of the plane of the web portion, the tab being resiliently urged towards the lower portion of a second wall of the cavity opposite to the first wall, the tab being adapted to cooperate with a male contact element which is inserted into the cavity.

The connector according to this invention is characterized in that the contact element comprises a substantially flat web portion which presses against the side of the cavity adjacent to an outer longitudinal face of the insulating block and a central part of the web portion is cutout and bent to form a contact tab extending outside the plane of the web portion. The tab is resiliently urged elastically towards the bottom part of the opposite wall of the cavity to cooperate with the male contact element to be connected thereto.

It will be clear that with such an arrangement, two cavities situated in the same transverse plane of the insulating block contain contact elements whose tabs converge toward the longitudinal plane of symmetry of the block. When an integrated circuit or other plug-in component is plugged in, the connecting male elements, which are slightly divergent in construction, will normally encounter the tabs. If one of the male contact elements is not plugged in correctly it will be flattened toward the edge of the insulating block and the defect will appear in the control tests. Hence, proper mating of the plug-in component is assured, and improper mating is readily detected.

BRIEF DESCRIPTION OF THE DRAWINGS

FIG. 3 shows, on a larger scale, a contact of the connector in its cavity provided in the insulating block.

FIG. 4 is a front view, partly cut away, of a set of finished contacts ready to be inserted into the insulating block.

FIG. 5 is a sectional view of a contact of a known type with a component improperly plugged in.

DESCRIPTION OF THE PREFERRED EMBODIMENTS

Figure 1:
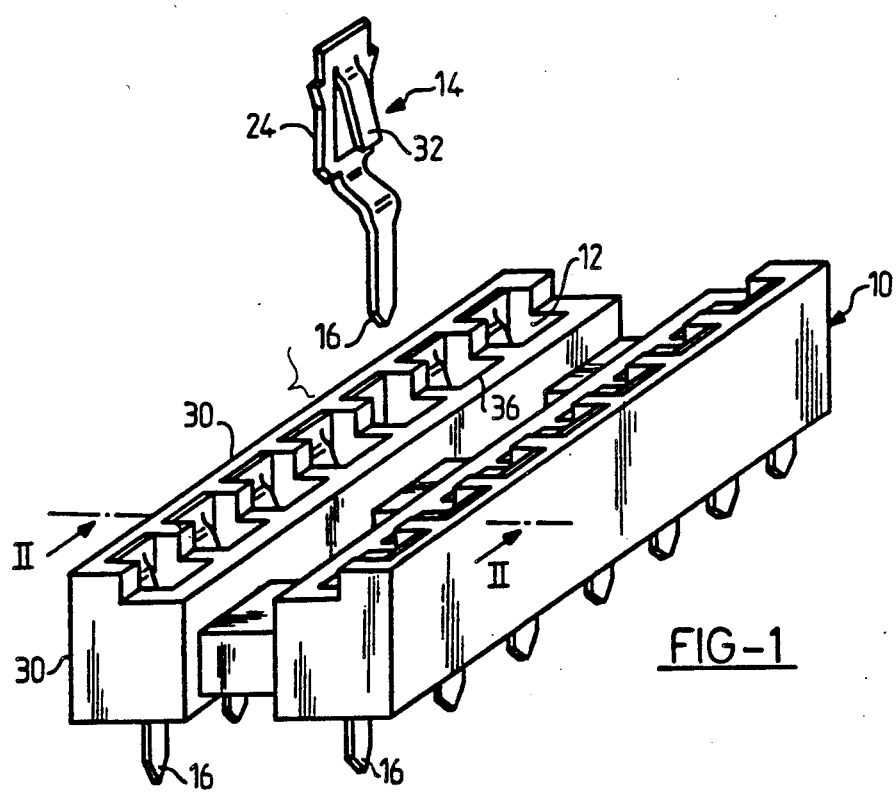
FIG. 1 is a perspective view of a connector support according to this invention with one contact removed from its cavity.
Figure 2:
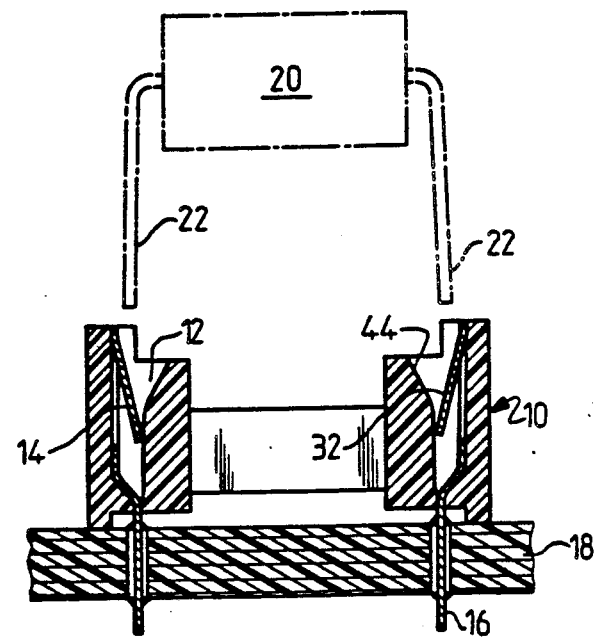
FIG. 2 is a sectional view along line II—II in FIG. 1, also showing the housing of a component to be plugged into the connector, and a printed circuit board on which the connector is mounted.

FIGS. 1 and 2 show a support block of insulating material 10 comprising two parallel longitudinal rows of cavities 12. In each cavity there has been introduced and secured a female contact element 14 such as the one shown in perspective in FIG. 1 and which will be described in detail below. Each of the various contact elements 14 has a connecting tail 16 designed to be inserted and soldered in a printed circuit board or card 18.

FIG. 2 shows, in broken lines, a plug-in component 20 whose male contact elements 22 are designed to be engaged in the corresponding cavities and to cooperate electrically with the female or socket contacts 14 located therein.

Contact element 14 will now be described with reference more particularly to FIGS. 3 and 4.

FIG. 3, which is an enlarged view of a part of FIG. 2, shows the contact element 14 in side view in a cavity 12 formed in insulating block 10.

FIG. 4 is a plan view of contact 14 corresponding to the profile view in FIG. 3 and shows the contact 14 integral with a carrier strip 21 used in its manufacture and also shows, in partial view, the adjacent contacts designed to be inserted in the corresonding adjacent cavities. Reference numeral 23 indicates a breakaway line for separation of the carrier strip after the contacts have been inserted and retained in the block at the end of the assembly process.

Contact 14 has a substantially flat web portion 24 of rectangular shape corresponding to the longitudinal dimension of the cavity. Two cutout edges 26 are provided to facilitate insertion. Two barbs 28 are provided which will stick into the walls of the cavity to retain the contact in place.

Web portion 24 presses against the side of the cavity 12 which is adjacent to the outer longitudinal face 30 of the parallelopipedic-shaped insulating block 10. By a stamping operation, there is formed a cutout in web portion 24 in the form of a U with a square base, and by bending a tab 32 is formed, which is connected to the upper part of contact 14 by a bent attachment 34, whose shape is such that tab 32 will be resiliently urged towards the side 36 of cavity 12 opposite the one against which web portion 24 rests. To avoid an accidental pinching of tab 32 in the recess formed by the U-shaped cutout, two strike points 38 are provided to prevent the undesired reentry of the tab.

As shown in FIG. 3, the bottom of cavity 12 is funnel-shaped which facilitates the penetration of leg 16 when the contact is inserted. The passage of leg 16 into the bottom of the cavity takes place in contact with flexible lips preventing the entry of contaminants (rise of the washing flux or solder) into the cavity.

Two curved portions 40 and 42 are provided between web portion 24 and connecting leg 16 so that the contact will conform to the funnel-shape of the bottom of the cavity. The resultant bayonet structure makes it possible to align leg 16 in the connector with male contact element 22 of component 20 (see FIG. 2).

To facilitate the introduction of male contact elements 22, an inclined surface 44 is provided at the top of each cavity.

The contact element just described is advantageously made of a conductive material with high elastic limit, with tab 32 being relatively short.

The free end of tab 32 can easily be plated with tin or gold in a selective, localized manner to facilitate electrical contact with plugged-in male contact element 22.

It can be seen that the connector of this invention avoids the drawbacks of the known connectors in which a faulty fit of the plugged-in contact is not detected in the course of a visual or electrical inspection.

FIG. 5 shows a defective plug-in providing an electrical "connection" with a known contact. The male contact element 122 of component 120 is curved inward, and its faulty fit cannot be found in a visual inspection. The electrical contact between male contact element 122 and loop 130 of the strip 132 of contact element 114 is such that the defect cannot be detected electrically, and yet it is clear that such a connection is undesirable.

I claim:

1. In an electrical connector particularly for use in mounting an electronic component having two parallel rows of terminals to a support, such as a printed circuit board, said connector comprising an insulating block having two rows of cavities, each cavity containing a contact element introduced through an opening provided at the top of said cavity, said contact element including a leg projecting through a substantially sealed passage at the bottom of said cavity for connection with said support, the improvement comprising said contact element comprises a substantially flat web portion pressing against a substantially flat first wall of said cavity adjacent to an external longitudinally extending face of said insulating block, the central portion of said web portion being cut out and bent to form a substantially flat contact tab extending out of the plane of said web portion, said tab being resiliently urged to engage a lower portion of a second wall of said cavity opposite to said first wall in the absence of a mating terminal being received in said cavity, said lower portion being substantially flat, said tab being adapted to cooperate with a male contact element which is inserted into said cavity, said tab being in the form of a rectangle extending generally along the length of said web portion which is also rectangular, an upper side of said rectangle of said tab forming an articulation with the top of said web portion and a side of said tab opposite to said upper side of said rectangle of said tab forming a rectilinear free end adapted to cooperate with said male contact element, said web portion being connected to said leg by two bent portions such that said leg is offset from said web portion such that said leg extends substantially as an extension of said lower portion of said second wall and being substantially in alignment with said free end of said tab, whereby said leg is aligned with said male contact element.

2. The connector of claim 1, wherein said second wall comprises an inclined surface to facilitate insertion of said male contact element.

3. The connector of claim 1, wherein projections in the form of strike points extending into said cut out are provided on said web portion adjacent to said articulation to prevent return of said tab into said cut out central portion.

4. The connector of claim 3, wherein the outer edges of said web portion comprise locking barbs disposed substantially flush with said projections, said locking barbs being effective to retain said contact element in said cavity.

5. The connector of claim 1, wherein said free end of said tab has a rounded edge.

6. The connector of claim 1, wherein said free end of said tab is plated with a conductive material.

7. The connector of claim 1, wherein said insulating block has a parallelpipedic shape.

8. The connector of claim 1, wherein the bottom of each of said cavities has a funnel-shape through which said leg extends.

* * * * *